United States Patent
Chen et al.

(10) Patent No.: US 6,617,890 B1
(45) Date of Patent: Sep. 9, 2003

(54) MEASURING POWER SUPPLY STABILITY

(75) Inventors: Tsung-Hao Chen, Madison, WI (US);
Peter Hazucha, Beaverton, OR (US);
Atila Alvandpour, Portland, OR (US);
Tanay Karnik, Portland, OR (US);
Chung-Ping Chen, Middleton, WI (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 10/104,393

(22) Filed: Mar. 22, 2002

(51) Int. Cl.[7] .............................. H03K 5/153
(52) U.S. Cl. ............................ 327/78; 327/87
(58) Field of Search ............... 327/60, 63, 64, 327/70, 72, 77–83, 89, 90, 217

(56) References Cited

U.S. PATENT DOCUMENTS

| | | | | |
|---|---|---|---|---|
| 5,774,185 A | * | 6/1998 | Nayebi et al. | 348/531 |
| 5,818,274 A | * | 10/1998 | Lombreschi et al. | 327/217 |
| 5,970,074 A | * | 10/1999 | Ehiro | 714/745 |
| 6,018,370 A | * | 1/2000 | Nayebi et al. | 327/538 |
| 6,348,816 B1 | * | 2/2002 | Havens et al. | 327/58 |

* cited by examiner

*Primary Examiner*—My-Trang Nu Ton
(74) *Attorney, Agent, or Firm*—Fish & Richardson P.C.

(57) ABSTRACT

A system for measuring the stability of a power signal from a power supply includes a threshold violation detector. The threshold violation detector includes a comparator and an indicator. The comparator has a power signal input, a threshold signal input, and a comparison result output, and is configured to compare the power signal on the power signal input with a threshold on the threshold signal input to present a comparison result signal on the comparison result output. The indicator has a threshold violation output and a comparison input that receives the comparison result signal from the comparator. The indicator presents a threshold violation signal on the threshold violation output when the comparison result signal indicates that the power signal has violated the threshold.

30 Claims, 5 Drawing Sheets

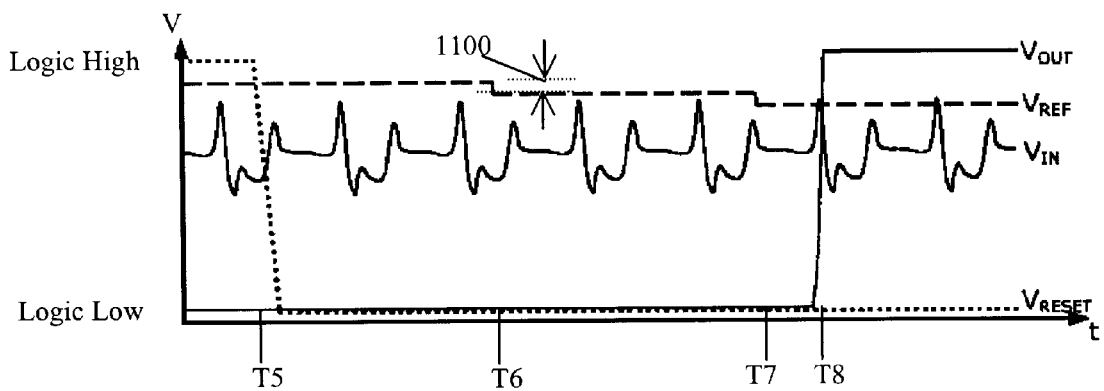
FIG. 11
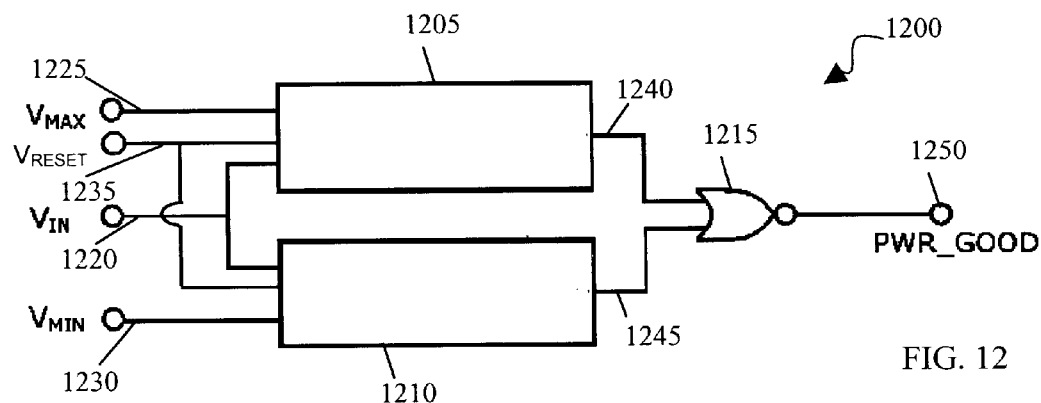
FIG. 12
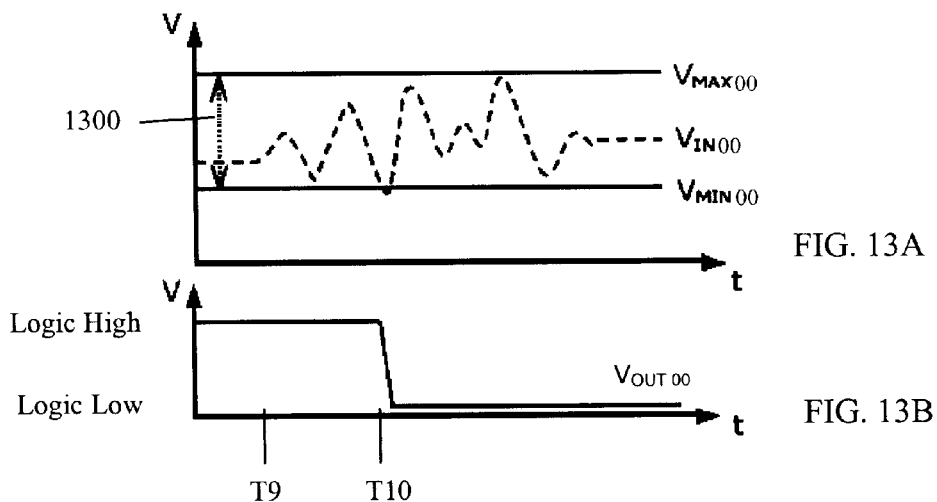
FIG. 13A
FIG. 13B

MEASURING POWER SUPPLY STABILITY

TECHNICAL FIELD

This invention relates to measuring power supply stability.

BACKGROUND

Ideal power supplies maintain a constant output over an infinite range of loads. Real power supplies, on the other hand, will deliver an output that varies with, for example, the load on the supply, temperature, and line-voltage. For voltage power supplies, as supply current requirements increase and supply voltages decrease, minimizing output voltage variations generally becomes more difficult.

This problem is particularly germane to the microelectronics industry, where each generation of devices tends to require more current to operate at lower voltages than the previous generation. Moreover, as the load current increases, the magnitude of the voltage droop due to parasitic impedance of the package, socket, and motherboard interconnects also increases. As a result, it has become increasingly difficult to maintain on-die supply voltage levels within windows in which device performance is acceptable.

DESCRIPTION OF DRAWINGS

FIG. 11 is a graph illustrating exemplary waveforms during the measurement of noise amplitude using the detector.

FIG. 12 is a block diagram of another detector.

FIG. 13A is a graph illustrating exemplary input waveforms during the operation of the other detector.

FIG. 13B is a graph illustrating an exemplary output waveform during the operation of the other detector with the input waveforms of FIG. 13A.

Like reference symbols in the various drawings indicate like elements.

DETAILED DESCRIPTION

Figure 1:
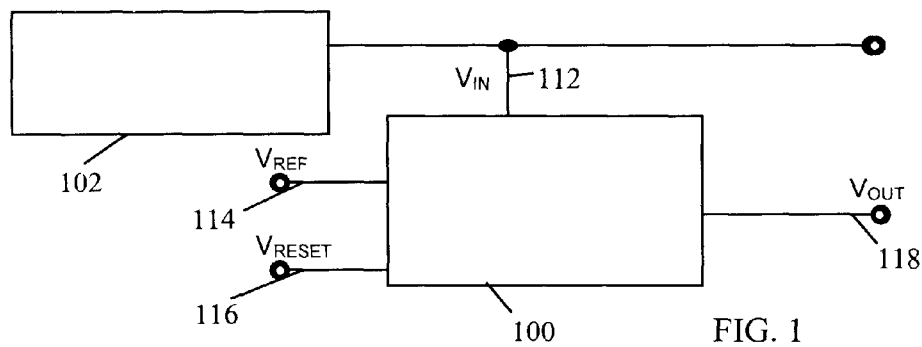
FIG. 1 is a block diagram of a threshold violation detector and a power supply.

Referring to FIG. 1, a threshold violation detector 100 is connected to a voltage power supply 102. Inputs to detector 100 are the output 112 ($V_{IN}$) of the power supply 102, a reference voltage 114 ($V_{REF}$), and a reset voltage 116 ($V_{RESET}$) Detector 100 has a single output 118 ($V_{OUT}$). The input 112 ($V_{IN}$) provides the detector 100 with the varying output of power supply 102 that is to be monitored by the detector 100. Input 114 ($V_{REF}$) presents a threshold reference voltage against which the varying output is compared. Input $V_{RESET}$ 116 presents a reset signal to detector 100. Output 118 ($V_{OUT}$) carries a detector output voltage that indicates when the supply voltage on input 112 ($V_{IN}$) has crossed the threshold reference voltage on input 114 ($V_{REF}$). Output 118 ($V_{OUT}$) may be reset using the reset signal on input 116 ($V_{RESET}$), as discussed further below. Detector 100 may be implemented on-die with a microprocessor or other integrated circuits. For example, detector 100 may be implemented using CMOS devices.

Figure 2:
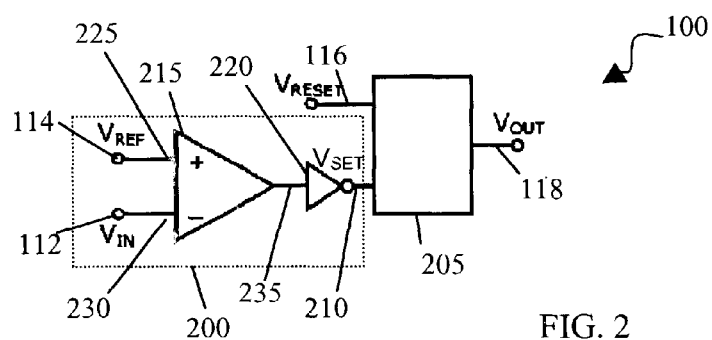
FIG. 2 is a block diagram of the detector.

Referring to FIG. 2, one implementation of the detector 100 includes a comparator 200 and a RS latch 205. Comparator 200 receives the inputs 112 ($V_{IN}$) and 114 ($V_{REF}$), and presents an output 210 ($V_{SET}$) to RS latch 205. RS latch 205 has inputs 210 ($V_{SET}$) and 116 ($V_{RESET}$), and output 118 ($V_{OUT}$). Comparator 200 includes an amplifier 215 and an inverter 220.

The non-inverting input 225 of amplifier 215 receives the threshold reference voltage on input 114 ($V_{REF}$) and the inverting input 230 of amplifier 215 receives the supply voltage on input 112 ($V_{IN}$). Amplifier 215 also has an amplifier output 235 that presents an amplifier output voltage to inverter 220.

Amplifier 215 amplifies the voltage difference between the supply voltage on inverting input 230 and the threshold reference voltage on non-inverting input 225 to generate an amplifier output voltage on amplifier output 235. The influence of the open loop gain of amplifier 215 is discussed in regard to FIGS. 8 and 9.

Inverter 220 receives the amplifier output voltage and presents a set voltage to RS latch 205 on output 210 ($V_{SET}$). In particular, when the amplifier output voltage indicates that the threshold reference voltage on non-inverting input 225 is greater than the supply voltage on inverting input 230, inverter 220 presents a logic low set voltage on output 210 ($V_{SET}$), and, when the amplifier output voltage indicates that the threshold reference voltage on non-inverting input 225 is less than the supply voltage on inverting input 230, inverter 220 presents a logic high set voltage on output 210 ($V_{SET}$).

RS latch 205 has inputs 210 ($V_{SET}$) and 116 ($V_{RESET}$), and output 118 ($V_{OUT}$). A logic high reset signal on input 116 ($V_{RESET}$) resets RS latch 205 when the set voltage 210 ($V_{SET}$) indicates that the supply voltage on input 112 ($V_{IN}$) is on the acceptable side of the threshold reference voltage on input 114 ($V_{REF}$). Resetting drives the detector output voltage on output 118 ($V_{OUT}$) to logic low. After the reset signal on input 116 ($V_{RESET}$) transitions to logic low, RS latch 205 maintains a logic low output voltage on output 118 ($V_{OUT}$) until the set voltage on input 210 ($V_{SET}$) transitions to indicate that the supply voltage on input 112 ($V_{IN}$) is on the unacceptable side of the threshold reference voltage on input 114 ($V_{REF}$). At this time, RS latch 205 presents a logic high output voltage on output 118 ($V_{OUT}$). RS latch 205 maintains the logic high output voltage on output 118 ($V_{OUT}$) until RS latch 205 is reset by another logic high reset signal applied to input 116 ($V_{RESET}$).

Figure 3:
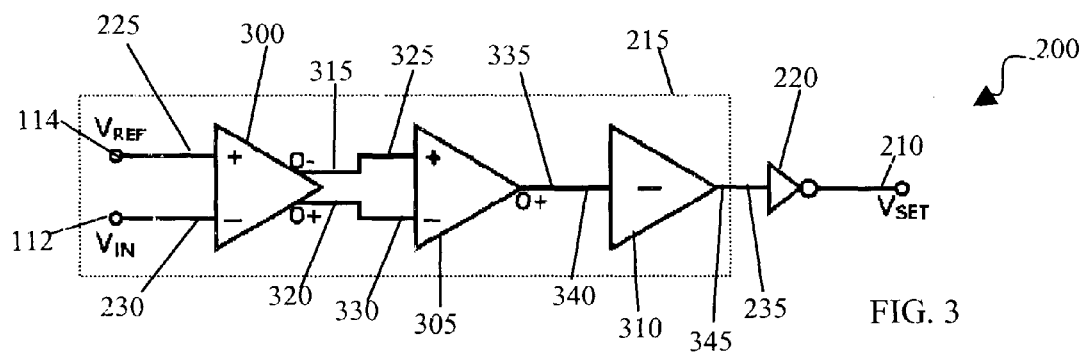
FIG. 3 is a block diagram of a comparator for use in the detector.

Referring to FIG. 3, the amplifier 215 of comparator 200 may include a cascade of a first differential amplifier 300, a second differential amplifier 305, and an analog inverter 310. First differential amplifier 300 includes non-inverting input 225, inverting input 230, a negative output O_ 315, and a positive output O$_+$ 320. Second differential amplifier 305 has a non-inverting input 325 connected to the negative output O_ of amplifier 300, an inverting input 330 connected to the positive output O_+ of amplifier 300, and a positive output O_+ 335. Analog inverter 310 includes an input 340 connected to the output of amplifier 305 and an output 345.

First differential amplifier 300 receives input 112 ($V_{IN}$) on inverting input 230 and input 114 ($V_{REF}$) on non-inverting input 225 and presents a first output voltage on negative output O_ 315 and a second output voltage on positive output O_+ 320. First differential amplifier 300 amplifies the difference between the threshold reference voltage on non-inverting input 225 and the supply voltage on inverting input 230 with negative gain to produce the first output voltage on negative output O_ 315 and with positive gain to produce the second output voltage on positive output O_+ 320.

Second differential amplifier 305 receives the first output voltage of first differential amplifier 300 on non-inverting input 325 and the second output voltage of first differential amplifier 300 on inverting input 330 and produces an output voltage on positive output O_+ 335. Second differential amplifier 305 amplifies the difference between the first output voltage on non-inverting input 325 and the second output voltage on inverting input 330 with positive gain to produce the output voltage on positive output O_+ 335.

Analog inverter 310 receives the output voltage of second differential amplifier 305 on input 340 and presents an inverted output voltage on output 345. The cascade of first differential amplifier 300, second differential amplifier 305, and analog inverter 128 increases the net open loop gain of amplifier 215. Moreover, the use of both positive and negative outputs 315, 320 of first differential amplifier 300 improves the tolerance of amplifier 215 to variability in the supply voltages and manufacturing processes.

Figure 4:
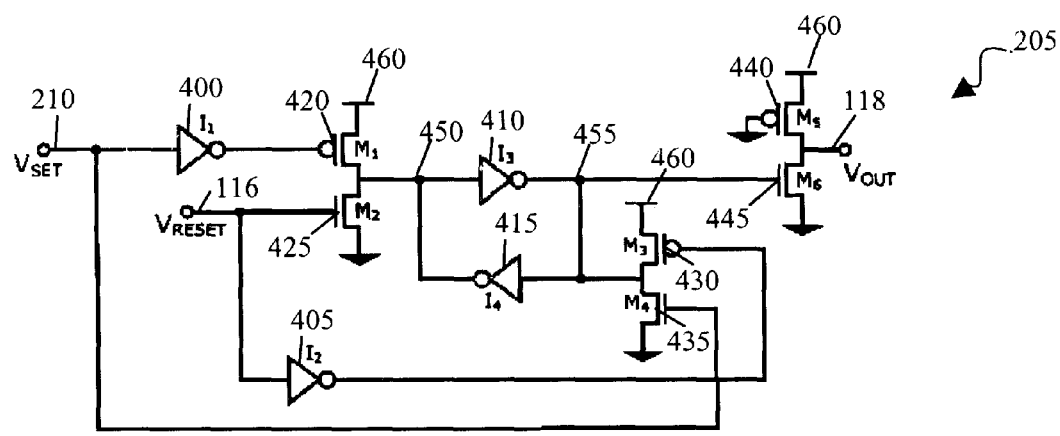
FIG. 4 is a block diagram of a latch for use in the detector.

Referring to FIG. 4, RS latch 205 which is adapted for maximum detection, includes inputs 210 ($V_{SET}$) and 116 ($V_{RESET}$) and output 118 ($V_{OUT}$). As shown, RS latch 205 may be implemented using inverters I1 400, I2 405, I3 410, I4 415, transistors M1 420, M2 425, M3 430, M4 435, MS 440, M6 445, and nodes 450, 455. RS latch 205 is supplied with a positive supply voltage on a supply line 460. When the set voltage on input 210 ($V_{SET}$) is logic low, transistors M4 435 and M1 420 turn off. When the set voltage on 210 ($V_{SET}$) is logic high, transistors M4 435 and M1 420 turn on. When the reset voltage on 116 ($V_{RESET}$) is logic low, transistors M2 425 and M3 430 turn off. When the set voltage on 116 ($V_{RESET}$) is logic high, transistors M2 425 and M3 430 turn on.

A logic high reset signal on input 116 ($V_{RESET}$) while the set voltage on input 210 ($V_{SET}$) is logic low resets RS latch 205. Namely, since the set voltage on input 210 ($V_{SET}$) is logic low, transistors M4 435 and M1 420 are turned off and the logic high reset signal on input 116 ($V_{RESET}$) turns on transistors M2 425 and M3 430. This draws the voltage on node 450 to logic low and the voltage on node 455 toward logic high. As the voltage on node 455 moves toward logic high, it turns transistor M6 445 on and draws the detector output voltage on output 118 ($V_{OUT}$) to logic low.

Once the reset signal on input 116 ($V_{RESET}$) changes to logic low, transistors M2 425 and M3 430 turn off. However, RS latch 205 maintains a logic low output voltage on output 118 ($V_{OUT}$). In particular, inverters I3 410 and I4 415 maintain the voltage on node 450 at logic low and the voltage on node 455 at logic high.

The logic low output of RS latch 205 is maintained until the set voltage on input 210 ($V_{SET}$) transitions to logic high and turns on transistors M4 435 and M1 420. This draws the voltage on node 450 toward logic high and the voltage on node 455 to logic low. The logic low voltage on node 455 turns off transistor M6 445, allowing transistor M5 440 to draw the output voltage on output 118 ($V_{OUT}$) toward a logic high output voltage.

Once the set signal on input 210 ($V_{SET}$) changes to logic low, transistors M4 435 and M1 420 turn off. However, RS latch 205 maintains a logic high output voltage on output 118 ($V_{OUT}$). In particular, inverters I3 410 and I4 415 maintain the voltage on node 450 at logic high and the voltage on node 455 at logic low. This maintenance continues until a logic high reset signal on input 116 ($V_{RESET}$) resets RS latch 205, as discussed above.

Figure 5:
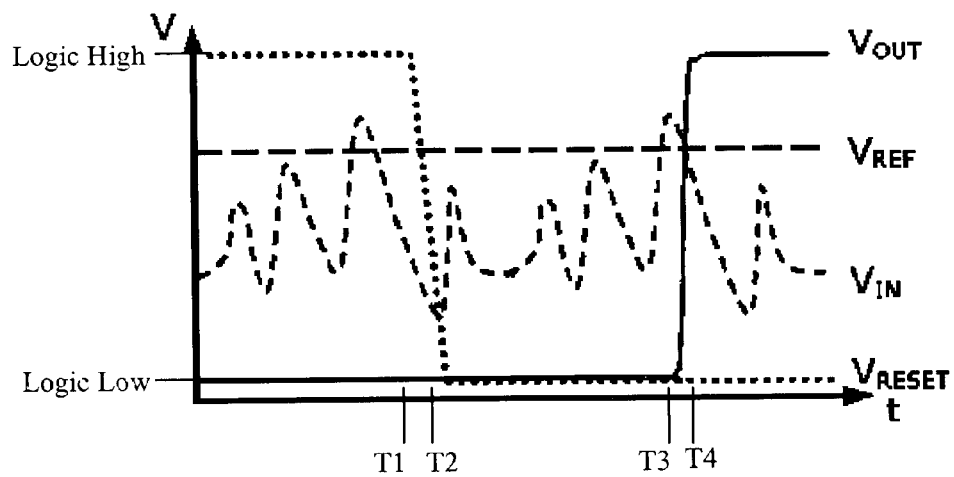
FIG. 5 is a graph illustrating an exemplary operation of the detector.

Exemplary time traces of a threshold reference voltage $V_{REF}$, a reset voltage $V_{RESET}$, a detector input voltage $V_{IN}$, and a detector output voltage $V_{OUT}$ during operation of detector 100 are shown in FIG. 5. Threshold reference voltage $V_{REF}$ defines, for example, the uppermost acceptable output voltage of a power supply. Reset voltage $V_{RESET}$ resets RS latch 205 of detector 100 when, for example, detector 100 is powered up or a predetermined time after detector 100 has detected a threshold crossing. Input voltage $V_{IN}$ is, for example, the supply voltage output by power supply 102. Detector output voltage $V_{OUT}$ indicates when input voltage $V_{IN}$ crosses threshold reference voltage $V_{REF}$.

Referring to FIGS. 2–5, at a time T1, detector input voltage $V_{IN}$ is below threshold reference voltage $V_{REF}$. The set voltage (not shown) on input 210 ($V_{SET}$) is thus logic low, and the reset voltage $V_{RESET}$ is logic high. This resets detector 100, drawing the detector output voltage $V_{OUT}$ to logic low.

At time T2, reset voltage $V_{RESET}$ changes to logic low. However, RS latch 205 maintains output voltage $V_{OUT}$ at logic low until time T3 when input voltage $V_{IN}$ rises above threshold reference voltage $V_{REF}$. The set voltage (not shown) on input 210 ($V_{SET}$) rises to logic high which draws the detector output voltage $V_{OUT}$ to logic high at time T4.

Referring to FIGS. 4 and 5, the components of RS latch 205 may be configured to increase the bandwidth of the detector. In particular, transistors M1 420, M4 435 may be made small so that they are able to respond more quickly to a change in the set voltage on input 210 ($V_{SET}$). Smaller transistors M1 420, M4 435 decrease the parasitic capacitive load on the set voltage, leading to higher bandwidth. Transistors M1 420, M4 435 may have, for example, an input capacitance smaller than $1 \times 10^{-14}$ F. Furthermore, transistor M6 445 may also be made small to speed the response to a change in the voltage on node 455. Transistor M6 445 may also have, for example, an input capacitance smaller than $1 \times 10^{-14}$ F. As a consequence of such sizing of components, the input capacitance of input 210 ($V_{SET}$) may be made smaller than the input capacitance of 116 ($V_{RESET}$).

The trip points of inverters I3 410, I4 415 may also be selected to increase the bandwidth of the detector. In particular, I3 410 may be configured to have a trip point below the midpoint between logic high and logic low and I4 415 may be configured to have a trip point above the midpoint between logic high and logic low. In general, the trip point of an inverter may be configured, for example, by sizing the transistors of the inverter. For example, making a pMOS device larger may increase the trip point, and making an nMOS device larger may decrease the trip point. The trip point of inverter I3 410 may be above logic low by, for example, less than 35% of the difference between logic high and logic low, and the trip point of inverter I4 415 may be above logic low by, for example, greater than 65% (for example, 70%) of the difference between logic high and logic low.

Figure 6:
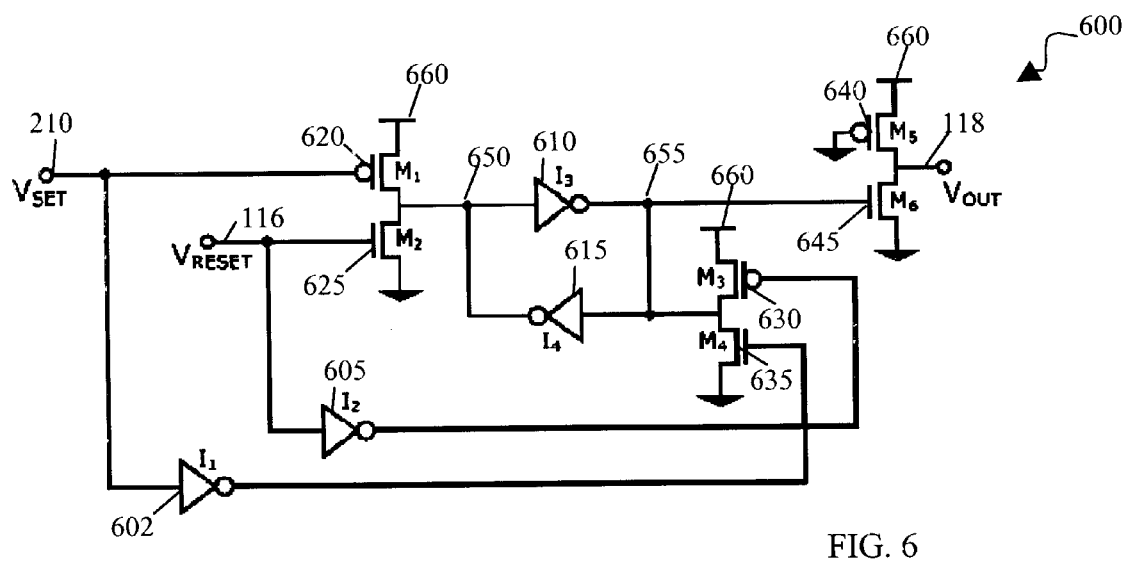
FIG. 6 is a block diagram of another latch for use in the detector.

Referring to FIG. 6, another RS latch 600, adapted for minimum detection, is laid out similarly to RS latch 205. RS latch 600 includes inputs 210 ($V_{SET}$) and 116 ($V_{RESET}$) and output 118 ($V_{OUT}$). As shown, RS latch 600 may be implemented using inverters I1 602, I2 605, I3 610, I4 615, transistors M1 620, M2 625, M3 630, M4 635, M5 640, M6 645, and nodes 650, 655. RS latch 600 is supplied with a positive supply voltage on a supply line 660. RS latch 600 differs from RS latch 205 in that inverter I1 602 has been shifted from between input 210 ($V_{SET}$) and transistor M1 620 to between input 210 ($V_{SET}$) and transistor M4 635. As a result of this shift, transistors M4 635 and M1 620 turn on when the set voltage on 210 ($V_{SET}$) is logic low, and transistors M4 635 and M1 620 turn off when the set voltage on 210 ($V_{SET}$) is logic high.

A logic high reset signal on input 116 ($V_{RESET}$) while the set voltage on 210 ($V_{SET}$) is logic high resets RS latch 600. Namely, since the set voltage on input 210 ($V_{SET}$) is logic high, transistors M4 635 and M1 620 are turned off and the logic high reset signal on input 116 ($V_{RESET}$) turns transistors M2 625 and M3 630 on. This draws the voltage on node 650 to logic low and the voltage on node 655 toward logic high. As the voltage on node 655 moves toward logic high, it turns transistor M6 645 on and draws the detector output voltage on output 118 ($V_{OUT}$) to logic low.

Once the reset signal on input 116 ($V_{RESET}$) changes to logic low, transistors M2 625 and M3 630 turn off but RS latch 600 maintains a logic low output voltage on output 118 ($V_{OUT}$). In particular, inverters I3 610 and I4 615 maintain the voltage on node 650 at logic low and the voltage on node 655 at logic high.

This maintenance continues until the set voltage on input 210 ($V_{SET}$) transitions to logic low thereby turning on transistors M4 635 and M1 620. This draws the voltage on node 650 toward logic high and the voltage on node 655 to logic low. The logic low voltage on node 655 turns off transistor M4 635, which allows transistor M5 640 to draw the output voltage on output 118 ($V_{OUT}$) toward logic high. In other words, a logic high output voltage is presented on output 118 ($V_{OUT}$).

Once the set signal on input 210 ($V_{SET}$) changes to logic high, transistors M4 635 and M1 620 turn off. However, RS latch 600 maintains a logic high output voltage on output-118 ($V_{OUT}$). In particular, inverters I3 610 and I4 615 maintain the voltage on node 650 at logic high and the voltage on node 655 at logic low. This maintenance continues until a logic high reset signal on input 116 ($V_{RESET}$) resets RS latch 600, as discussed above.

Figure 7:
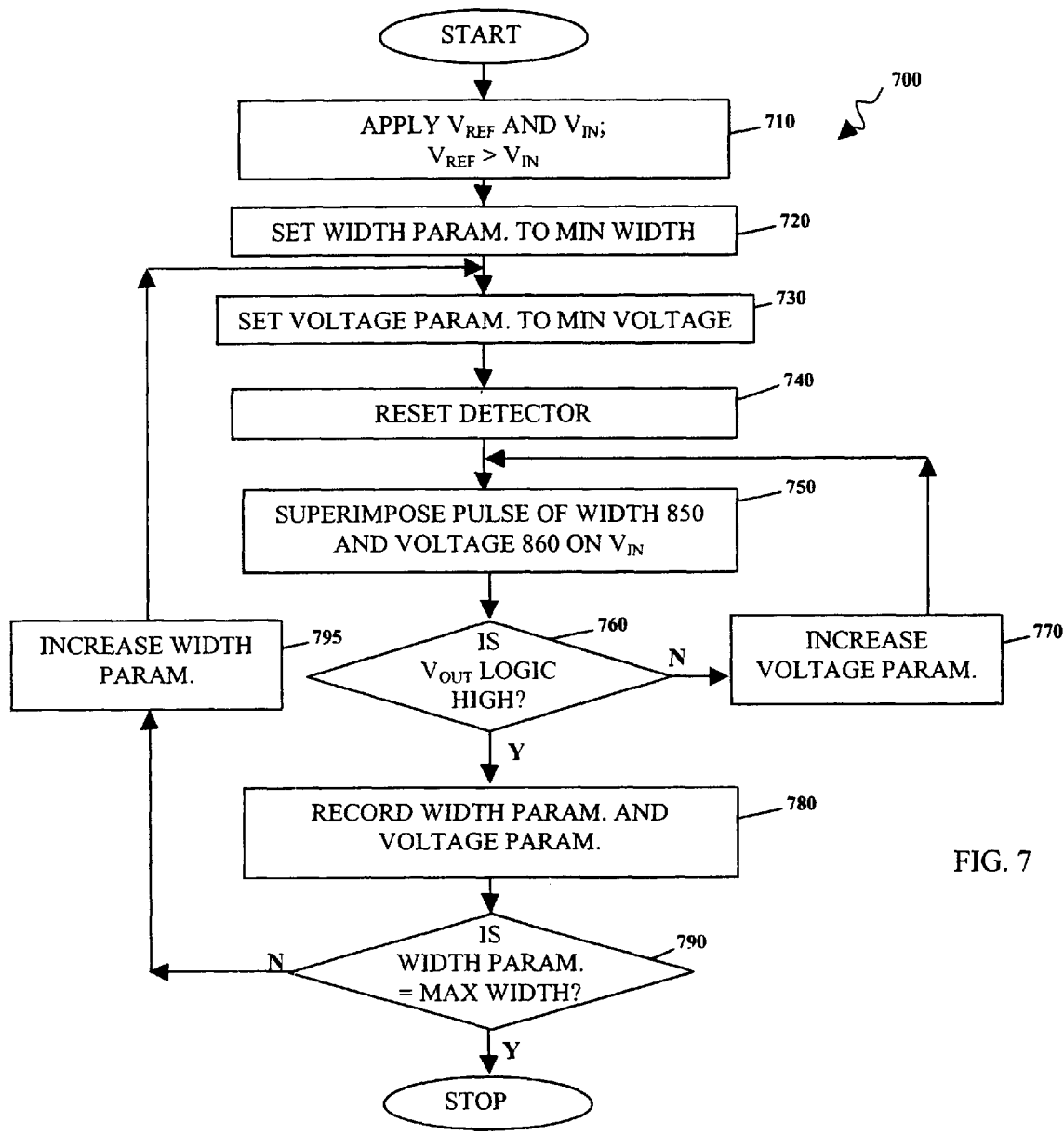
FIG. 7 is a flow chart of a method for determining sensitivity of the detector.
Figure 8:
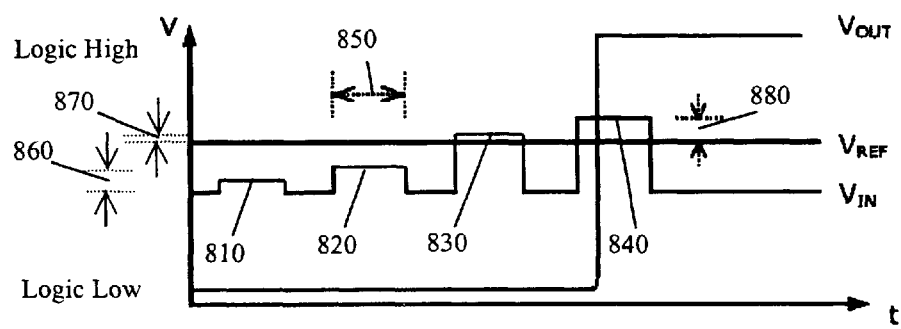
FIG. 8 is a graph illustrating exemplary waveforms during the determination of the sensitivity of the detector.

FIGS. 7 and 8 illustrate a process flow 700 for determining a sensitivity curve for detector 100 when adapted for maximum detection. Process flow 700 may be implemented using, for example, a pair of voltage sources, a pulse generator, and a microcomputer with an output capable of communicating with the pulse generator and inputs capable of at least measuring the logic state of $V_{OUT}$ and the output voltages of the voltage sources. Initially, threshold reference voltage $V_{REF}$ and supply voltage $V_{IN}$ are presented to detector 100 using the voltage sources configured such that threshold reference voltage $V_{REF}$ is greater than supply voltage $V_{IN}$ (710). Next, a parameter determining the width of a test pulse is set to a predetermined minimum value (min width) (720) and a parameter determining the voltage of a test pulse is set to a predetermined minimum value (min voltage) (730).

Detector 100 is reset (740) and a test pulse 810 is superimposed upon the supply voltage $V_{IN}$ using, for example, the pulse generator in conjunction with a respective one of the voltage sources (750). Test pulse 810 has a width 850 determined by the width parameter and a voltage 860 determined by the voltage parameter. The logic state of detector output voltage $V_{OUT}$ is then determined using, for example, an input of the microcomputer and examined (760). If detector output voltage $V_{OUT}$ is logic low, then the parameter determining the voltage is increased (770) and a further test pulse 820 with an increased voltage 860 is superimposed on the supply voltage $V_{IN}$ (770). This may be repeated as many times as needed. In other words, the parameter determining the voltage is successively increased and further test pulses 830 and 840 are generated until detector output voltage $V_{OUT}$ is logic high. When this happens, the values of the parameter determining the voltage and the parameter determining the width are recorded (780).

Next, the relationship between the current parameter determining the width and a predetermined maximum value (max width) is determined (790). If the parameter determining the width is less than the maximum value (max width), then the parameter determining the width is increased (795) and the voltage parameter is reset to the minimum value (730). The process is repeated as needed until the parameter determining the width is equal to the maximum value (max width), at which time process flow ends.

Referring to FIG. 8, although supply voltage $V_{IN}$ is greater than threshold reference voltage $V_{REF}$ during pulse 830 by a differential voltage 870, detector output voltage $V_{OUT}$ remains logic low during pulse 830. This may be due to, for example, amplifier 215 having an open loop gain that is too small to amplify the relatively small difference between Alternatively, supply voltage $V_{IN}$ and threshold reference voltage $V_{REF}$. the bandwidth of amplifier 215 and latch 205 may be too small to be able to capture a pulse of width 850, or amplifier 215 may have a positive input offset $V_{OFFSET}$ (not shown) that increases the actual threshold voltage of amplifier 215 above $V_{REF}$. The combined influence of the open loop gain of amplifier 215, the bandwidth of amplifier 215 and latch 205, an input offset, and other detector parameters may be determined empirically using process flow 700 and is referred to simply as the "sensitivity" of the detector.

Figure 9:
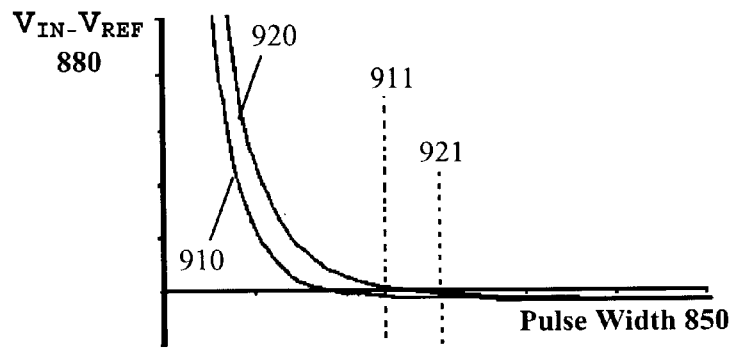
FIG. 9 is a graph illustrating exemplary sensitivity curves obtained during the determination of the sensitivity of the detector.

FIG. 9 illustrates exemplary sensitivity curves 910, 920 obtained using process flow 700 of FIG. 7. Sensitivity curves 910, 920 illustrate, for two different detectors, the minimum voltage differences between supply voltage $V_{IN}$ and threshold reference voltage $V_{REF}$ (voltage 860 of FIG. 8) that drive detector output voltage $V_{OUT}$ to logic high as a function of pulse width (width 850 of FIG. 8). Sensitivity curve 910 is obtained with a relatively sensitive detector with a cut-off width 911, whereas sensitivity curve 920 is obtained with a relatively insensitive detector with a cut-off width 921. When the pulse width is larger than width 911, the relatively sensitive detector responds to a small voltage overshoot by supply voltage $V_{IN}$ beyond threshold reference voltage $V_{REF}$. However, pulse width must be larger than width 921 for the relatively insensitive detector to respond to the same relatively small voltage overshoot. For either detector, pulse widths below the respective cut-off width 911, 921 require larger voltage differences between supply voltage $V_{IN}$ and threshold reference voltage $V_{REF}$. The required voltage differences increase as pulse width decreases.

As discussed above, the structural components of comparator 200 and RS latch 205 may be configured to increase the overall sensitivity of detector 100.

Figure 10:
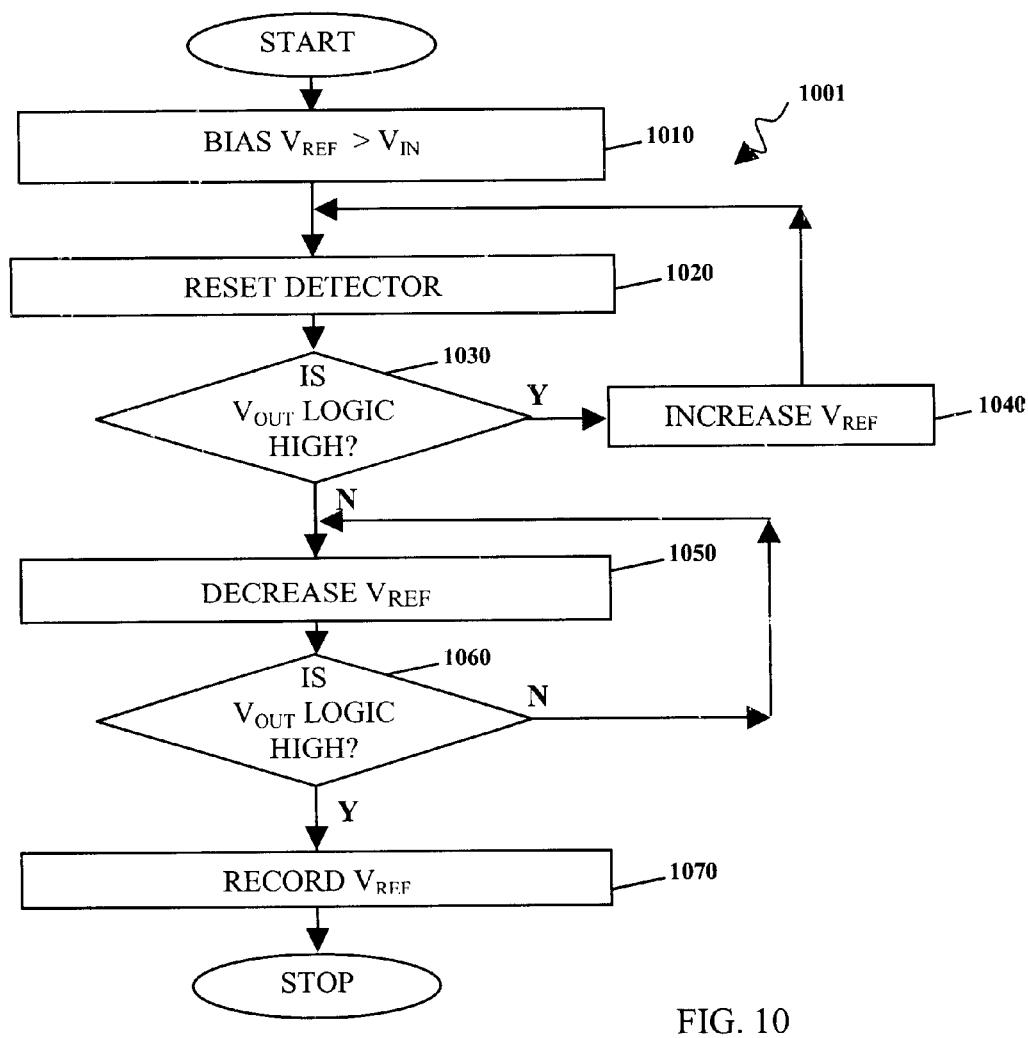
FIG. 10 is a flow chart of a method for measuring noise amplitude using the detector.

FIGS. 10 and 11 illustrate a process flow 1001 for measuring noise amplitude of a device such as, for example, a power supply, using detector 100. Process flow 1001 may be implemented using, for example, an adjustable voltage source and a microcomputer with a D/A converter and an input port capable of measuring the logic state of $V_{OUT}$. The device and detector are assembled, for example, as shown in FIG. 1.

Initially, threshold reference voltage $V_{REF}$ is presented to detector 100 using the adjustable voltage source such that the operator believes that the threshold reference voltage $V_{REF}$ is greater than supply voltage $V_{IN}$ (1010). Next, detector 100 is reset at time T5 (1020) and the logic state of detector output voltage $V_{OUT}$ is determined using, for example, the input port of the microcomputer and examined (1030). If detector output voltage $V_{OUT}$ is logic high, then the threshold reference voltage $V_{REF}$ has not been set sufficiently greater than supply voltage $V_{IN}$, and the threshold reference voltage $V_{REF}$ is increased (1040, not shown in FIG. 11). This process is repeated to increase threshold reference voltage $V_{REF}$ until $V_{OUT}$ remains logic low for a predetermined period. When this happens, the threshold reference voltage $V_{REF}$ is decreased at time T6 (1050). The magnitude of the decrease 1100 (1050) may be smaller than the magnitude of the previous increase (1040). The logic state of detector output voltage $V_{OUT}$ is again examined for a predetermined period from time T6 to time T7 (1060). If detector output voltage $V_{OUT}$ is logic low, then threshold reference voltage $V_{REF}$ is decreased again at time T7. Threshold reference voltage $V_{REF}$ is repeatedly decreased until detector output voltage $V_{OUT}$ is logic high. When this happens at time T8, the current $V_{REF}$ is recorded (1070) and the process flow 1001 ends.

Referring to FIG. 12, another detector 1200 includes a maximum detector 1205, a minimum detector 1210, and a NOR gate 1215. Maximum detector 1205 may be, for example, a detector 100 including a comparator 200 and a RS latch 205, as described above. Minimum detector 1210 may be, for example, a detector 100 including a comparator 200 and a RS latch 600, as described above.

Detector 1200 has inputs $V_{IN}$ 1220, $V_{MAX}$ 1225, $V_{MIN}$ 1230, and $V_{RESET}$ 1235, nodes 1240, 1245, and an output PWR_GOOD 1250. Input $V_{IN}$ 1220 presents an input voltage to detector 1200 and may he connected, for example, to the voltage supply output of a power supply. Input $V_{MAX}$ 1225 presents a maximum reference voltage to detector 1200. Input $V_{MIN}$ 1230 presents a minimum reference voltage to detector 1200. Input $V_{RESET}$ 1235 presents a reset signal to detector 1200. Node 1240 carries a maximum detector output voltage that indicates when the voltage on input $V_{IN}$ 1200 is greater than the maximum threshold reference voltage on input $V_{MAX}$ 1225. Node 1245 carries a minimum detector output voltage that indicates when the supply voltage on input $V_{IN}$ 1200 is less than the minimum threshold reference voltage on input $V_{MIN}$ 1220. Nodes 1240, 1245 may be reset using the reset signal on input $V_{RESET}$ 1235. Output PWR_GOOD 1250 carries a detector output voltage that is logic low when either or both of the maximum detector output voltage on node 1240 and the minimum detector output voltage on node 1245 is logic high.

FIGS. 13A and 13B illustrate exemplary input waveforms and an exemplary output waveform, respectively, during the operation of detector 1200. Exemplary time traces show a maximum threshold reference voltage $V_{MAX\ 00}$, a minimum threshold reference voltage $V_{MIN\ 00}$, a detector input voltage $V_{IN\ 00}$, and a detector output voltage $V_{OUT\ 00}$ during operation of detector 1200. The difference between maximum threshold reference voltage $V_{MAX\ 00}$ and minimum threshold reference voltage $V_{MIN\ 00}$ defines a voltage band 1300 in which, for example, input voltage $V_{IN\ 00}$ is within an acceptable range.

Initially, for example at time T9, the input voltage $V_{IN\ 00}$ is less than the maximum threshold reference voltage $V_{MAX\ 00}$ and greater than the minimum threshold reference voltage $V_{MIN\ 00}$. As a result, the maximum detector output voltage on node 1240 and the minimum detector output voltage on node 1245 are logic low (not shown), and the detector output voltage $V_{OUT\ 00}$ is logic high. This continues until input voltage $V_{IN\ 00}$ crosses one of the maximum threshold reference voltage $V_{MAX\ 00}$ and the minimum threshold reference voltage $V_{MIN\ 00}$.

In the illustrated example of FIG. 13A, input voltage $V_{IN\ 00}$ falls below minimum threshold reference voltage $V_{MIN\ 00}$ at time T10. This drives minimum detector output voltage on node 1245 to logic high (not shown), and the detector output voltage $V_{OUT\ 00}$ to logic low where it is maintained until a logic high reset signal is presented (not shown) while the input voltage $V_{IN\ 00}$ is less than the maximum threshold reference voltage $V_{MAX\ 00}$ and greater than the minimum threshold reference voltage $V_{MIN\ 00}$.

The output voltages of the detectors 100 and 1200 may be used, for example, to test a power supply and the power requirements of circuitry. For example, detectors 100 and 1200 may implemented on a CMOS die and used to determine if other circuitry on the die such as, e.g., a microprocessor causes unacceptably large fluctuations in a supply voltage. Such testing may be done, for example, during the debugging of die designs and the binning of parts.

A number of implementations have been described. Nevertheless, it will be understood that various modifications may be made. Accordingly, other implementations are within the scope of the following claims.

What is claimed is:

1. A system for measuring the stability of a power signal from a power supply, comprising
    a threshold violation detector including:
        a comparator having a power signal input, a threshold signal input, and a comparison result output, the comparator configured to compare the power signal on the power signal input with a threshold on the threshold signal input to present a comparison result signal on the comparison result output; and
        an indicator having a threshold violation output and a comparison input receiving the comparison result signal from the comparator, the indicator presenting a threshold violation signal on the threshold violation output in response to an indication by the comparison result signal that the power signal has violated the threshold.

2. The system of claim 1 wherein:
    the threshold violation detector comprises a lower threshold violation detector; and
    the indicator has a lower threshold violation output and presents an lower threshold violation signal on the lower threshold violation output in response to the indication by the comparison result signal that the power signal has fallen below the threshold.

3. The system of claim 1 wherein:
    the threshold violation detector comprises an upper threshold violation detector; and
    the indicator has an upper threshold violation output and presents an upper threshold violation signal on the upper threshold violation output in response to the indication by the comparison result signal that the power signal has exceeded the threshold.

4. The system of claim 3 further comprising a lower threshold violation detector including:
   a second comparator having a second power signal input, a lower threshold signal input, and a comparison result output, the comparator configured to compare the power signal on the second power signal input with a lower threshold on the lower threshold signal input to present a comparison result signal on the comparison result output; and
   a second indicator having a lower threshold violation output and a comparison input receiving the comparison result signal from the second comparator, the second indicator presenting a lower threshold violation signal on the lower threshold violation output in response to an indication by the comparison result signal that the power signal has fallen below the lower threshold.

5. The system of claim 1 wherein the threshold violation detector is provided on-die with load circuitry.

6. The system of claim 5 wherein the threshold violation detector is provided on-die with a microprocessor.

7. The system of claim 1 further comprising a power supply having a power supply output coupled to the power signal input of the comparator.

8. The system of claim 1 wherein the comparator comprises a cascade of at least two differential amplifiers.

9. The system of claim 1 wherein the comparator is capable of directly driving the indicator.

10. The system of claim 1 wherein the indicator comprises a latch presenting the threshold violation signal on the threshold violation output in response to the indication by the comparison result signal that the power signal has violated the threshold.

11. The system of claim 10 wherein the latch comprises an RS latch having a reset input.

12. The system of claim 11 wherein:
   the comparison input has a comparison input capacitance;
   the reset input has a reset input capacitance; and
   the comparison input capacitance is less than the reset input capacitance.

13. The system of claim 12 wherein the comparison input has a comparison input capacitance less than 5×10–14 F.

14. The system of claim 10 wherein the latch comprises:
   a set portion configured to place the latch in a first state in response to the comparison result signal; and
   a reset portion configured to remove the latch from the first state in response to a reset signal.

15. The system of claim 14 wherein the set portion places the latch in the first state quicker than the reset portion removes the latch from the first state.

16. A system for measuring the stability of a power signal from a power supply, comprising
   a threshold violation detector including:
      a comparison device having a power signal input, an upper threshold signal input, a lower threshold signal input, and a comparison result output, the comparator configured to compare the power signal on the power signal input with an upper threshold on the upper threshold signal input and a lower threshold on the lower threshold signal input to present a comparison result signal on the comparison result output; and
      an indicator having a threshold violation output and a comparison input receiving the comparison result signal from the comparator, the indicator presenting a threshold violation signal on the threshold violation output in response to an indication by the comparison result signal that the power signal has violated one of the upper threshold and the lower threshold.

17. The system of claim 16 wherein the comparison device is provided on-die with load circuitry.

18. The system of claim 17 wherein the comparison device is provided on-die with a microprocessor.

19. The system of claim 16 further comprising a power supply having a power supply output coupled to the power signal input of the comparison device.

20. A method comprising:
   receiving a supply output of a power supply with a threshold violation detector; and
   starting a threshold violation signal in response to an indication that the supply output has violated a predetermined threshold.

21. The method of claim 20 wherein the threshold violation detector is on-die with load circuitry.

22. The method of claim 21 wherein the threshold violation detector is on-die with a microprocessor.

23. The method of claim 20 wherein starting the threshold violation signal comprises starting the threshold violation signal in response to a violation by the supply output of one of a predetermined upper threshold and a predetermined lower threshold.

24. The method of claim 20 further comprising starting a reset signal ending the threshold violation signal.

25. A method of determining the sensitivity of a threshold violation detector for monitoring when a supply output of a power supply violates a threshold, comprising:
   providing the threshold violation detector with the threshold;
   monitoring an output of the threshold violation detector for an indication that the supply output has violated the threshold;
   inputting a pulse having a dimension D to the threshold violation detector; and
   repeatedly incrementing the dimension D and inputting the pulse until the output of the threshold violation detector indicates that the pulse has violated the threshold.

26. The method of claim 25 wherein:
   the dimension D comprises a width of the pulse; and
   incrementing the dimension D comprises incrementing the width of the pulse.

27. The method of claim 25 wherein:
   the dimension D further comprises an amplitude of the pulse; and
   incrementing the dimension D further comprises incrementing the amplitude of the pulse.

28. A method of determining a noise level on a supply output of a power supply, comprising:
   providing a threshold violation detector with a threshold and the supply output of the power supply;
   monitoring an output of the threshold violation detector for an indication that the supply output has violated the threshold; and
   repeatedly incrementing the threshold toward the supply output of the power supply until the output of the threshold violation detector indicates that the supply output has violated the threshold.

29. The method of claim 28 wherein providing the threshold violation detector includes providing the threshold violation detector on-die with load circuitry.

30. The method of claim 29 wherein providing the threshold violation detector includes providing the threshold violation detector on-die with a microprocessor.

* * * * *